(12) United States Patent
Gonthier

(10) Patent No.: US 6,356,060 B1
(45) Date of Patent: Mar. 12, 2002

(54) SWITCHING CIRCUIT AND METHOD FOR USE IN A SWITCHING CIRCUIT

(75) Inventor: Laurent Gonthier, Tours (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/321,400

(22) Filed: May 28, 1999

(30) Foreign Application Priority Data

May 29, 1998 (FR) .............................................. 98 06972

(51) Int. Cl.⁷ .................................................. G05F 1/10
(52) U.S. Cl. ....................................................... 323/239
(58) Field of Search ................................ 323/239, 237, 323/320, 324

(56) References Cited

U.S. PATENT DOCUMENTS

| 3,475,653 A | 10/1969 | Odenberg et al. .............. 317/16 |
| 3,619,656 A | * 11/1971 | Domke ......................... 307/255 |
| 4,653,084 A | 3/1987 | Ahuja ........................... 379/29 |
| 6,038,150 A | * 3/2000 | Yee et al. ..................... 363/127 |

FOREIGN PATENT DOCUMENTS

| EP | A-0 221 574 | 5/1987 | .......... H02M/5/293 |
| EP | A-0 224 644 | 6/1987 | .......... H03K/17/30 |
| JP | A-61 121520 | 6/1986 | .......... H03K/17/16 |

OTHER PUBLICATIONS

Do–Hyun Jang, Gyu–Ha Choe, "A new APWM technique with harmonics elimination and power factor control in AC choppers", IEEE, p. 252, Nov. 1992.*

* cited by examiner

*Primary Examiner*—Peter S. Wong
*Assistant Examiner*—Gary L. Laxton
(74) *Attorney, Agent, or Firm*—Wolf, Greenfield & Sacks, P.C.; James H. Morris; Mark Steinberg

(57) ABSTRACT

The present invention relates to a bidirectional switching circuit including, in series, a bidirectional switching element controllable to be turned off and turned on, and a bidirectional conduction element forming a dipole and automatically selecting the conduction direction.

75 Claims, 6 Drawing Sheets

SWITCHING CIRCUIT AND METHOD FOR USE IN A SWITCHING CIRCUIT

BACKGROUND OF THE INVENTION

1. Field of the Invention

The present invention relates to the field of single-phase A.C./A.C. converters. The function of an A.C./A.C. converter is to control an A.C. load, generally from an A.C. voltage power system, for example, the mains. The all or nothing switch, and the power variation by full halfwaves or by pulse width modulation are among the most common functions implemented by A.C./A.C. converters.

2. Discussion of the Related Art

The control of an A.C. load from the A.C. voltage power system implies the use of a switch which is bidirectional both in current and voltage (called a four-quadrant switch). The most commonly used switch is the triac.

FIG. 1 very schematically shows a conventional example of single-phase gradator of a load 1(Q) to be supplied by an A.C. voltage Vac, for example, the mains voltage. The gradator is formed of a triac 2 in series with load 1 between two terminals 3, 4, across which voltage Vac is applied. Triac 2 receives, on a control terminal, a signal CTRL which sets the turn-on delay of triac 2 with respect to the zero crossing of voltage Vac.

A disadvantage of a switch such as shown in FIG. 1 based on a triac 2 (or on an antiparallel association of two thyristors) is that this switch is not controllable to be turned off. It can thus only spontaneously turn off at the zero crossing of its current.

Another disadvantage of such a switch, which is particularly significant with an essentially resistive and/or inductive load 1, is that the delayed turning-on with respect to the zero crossing causes high reactive power consumption. Further, such a turning-on creates uncontrollable current peaks linked to the current being out of phase with the voltage.

Another disadvantage of a switch such as shown in FIG. 1 is that it is impossible to immediately order the switching off of the load, for example, after a defect has been detected. The end of the current halfwave must indeed be awaited and the next triac turning-on must not be ordered.

Several A.C./A.C. converters have already been provided to replace triacs. These solutions use one or several bicontrollable components, that is, the turning-off and the turning-on of which only occur after they are ordered. Semiconductor switches are generally used. In the present state of the art, this means using components which may be turned off in a single quadrant of their current-voltage characteristic only (for example, bipolar transistors, MOS transistors, gate turn-off thyristors, insulated gate bipolar transistors, etc.). Accordingly, the making of bicontrollable four-quadrant switching circuits is generally done by the association of at least two semiconductor components which can be triggered (turned on) and blocked (turned off) in a single quadrant only.

The fact of using turn-off controllable switches raises a problem in the case of an inductive load. Indeed, there is a risk of turning-off the switch while it is conducting a non-zero current. In this case, a high overvoltage is created across the switch, which risks deteriorating the semiconductor component by putting it in avalanche. In practice, it is seldom possible to act upon the switch control to maintain the overvoltage under its avalanche voltage due to the excessively high (or unknown) value of the load inductance.

This problem of an inductive load is raised in practice in almost all supplied loads. Indeed, no load is completely without an inductance. Accordingly, when a turn-off controllable switch is used, it is practically always necessary to have a means for pulling the load current (free wheel operation) as the switch is turned off.

FIG. 2 shows a first conventional solution for enabling the use of a turn-off controllable switching circuit operating in the four quadrants of its current-voltage characteristic, in series with a load 1.

This solution consists of placing a capacitor C in parallel with a turn-on and turn-off controllable switch 5 operating in the four quadrants.

A disadvantage of such a solution is that it requires the use of a high voltage capacitor which is thus bulky and expensive. Further, this capacitor must be able to absorb a large current upon turning-off of switch 5.

Another disadvantage of this solution is that it introduces a permanent leakage current towards the load when switch 5 is off.

Another disadvantage of the solution discussed in relation with FIG. 3 is that such a capacitor is not integrable on a semiconductor material.

FIG. 3 shows a second conventional solution to make a four-quadrant switching circuit, i.e. operating as well when the voltage thereacross is positive or negative and when the current flowing therethrough is positive or negative. This solution uses an assembly including a first four-quadrant switch 5 in series with a load 1 between two terminals 3, 4 of application of an A.C. voltage Vac, for example, the mains voltage, and a second four-quadrant switch 6 (similar to switch 5) in parallel with load 1 to form a free wheel means.

A disadvantage of such a solution is that the assembly requires four bicontrollable semiconductor switches (two per switch 5, 6) and is particularly expensive.

Another disadvantage of this solution is that it requires a complex control circuit to ensure the synchronization between the controlled turning-on of switch 5 or of switch 6 and the respective controlled turning-off of switch 6 or of switch 5.

Another disadvantage of the solution shown in FIG. 3 is that, in practice, it most often requires a circuit to protect against possible overvoltages due to a turning-off under a non-zero current in case of a defect in the control circuit.

It should be noted that, in the two conventional solutions discussed hereabove in relation with FIGS. 2 and 3, switches 5 and 6, the structure of which has not been detailed, are most often formed, each, of at least two semiconductor switches controllable to be turned off and turned on in a single quadrant of their current-voltage characteristic. This could be, for example, a parallel association of two bipolar transistors each connected in series with a diode and where the diodes are antiparallel.

SUMMARY OF THE INVENTION

The present invention aims at providing a novel solution which overcomes the disadvantages of the above-described conventional solutions.

The present invention aims, in particular, at providing a solution which creates a leakage current in the off state which can be neglected with respect to the nominal on-current, and which is, for example, entirely integrable.

The present invention also aims at providing a novel switching circuit adapted to controlling any A.C. load, with this circuit being controllable to be turned off and turned on and operating in the four quadrants of its current-voltage characteristic.

To achieve these and other objects, the present invention provides a bidirectional switching circuit including, in series, a bidirectional switching element controllable to be turned off and turned on, and a bidirectional conduction element forming a dipole and automatically selecting the conduction direction.

According to an embodiment of the present invention, the bidirectional conduction element selects the conduction direction according to the voltage across a load controlled by the switching circuit.

According to an embodiment of the present invention, the turning-on of the switching element is allowed only when the voltage across the circuit and the current in the load to be controlled have the same sign.

According to an embodiment of the present invention, the bidirectional conduction element includes, in antiparallel between two terminals, two series associations of a thyristor with a diode, the gate and the anode of each thyristor being interconnected by an avalanche diode.

According to an embodiment of the present invention, the bidirectional conduction element includes, in antiparallel between two terminals, two thyristors, the respective gates of which are short-circuited with the corresponding power terminal.

The present invention also provides a converter of an A.C. voltage into an alternating current or conversely intended for a load, using at least one switching circuit of the present invention.

According to an embodiment of the present invention, the load is connected in parallel with the bidirectional conduction element, and in series with the bidirectional switching element between two terminals of application of an A.C. voltage.

According to an embodiment of the present invention, the load is connected in parallel with the series association of the switching element and of the bidirectional conduction element, a source of alternating current being connected in parallel on the switching element.

According to an embodiment of the present invention, the load is connected between two respective midpoints of two switching circuits of the present invention.

According to an embodiment of the present invention, the bidirectional conduction element selects the conduction direction according to the voltage level thereacross and/or according to the voltage variation thereacross.

The foregoing objects, features and advantages of the present invention will be discussed in detail in the following non-limiting description of specific embodiments in connection with the accompanying drawings.

DETAILED DESCRIPTION

Figure 1:
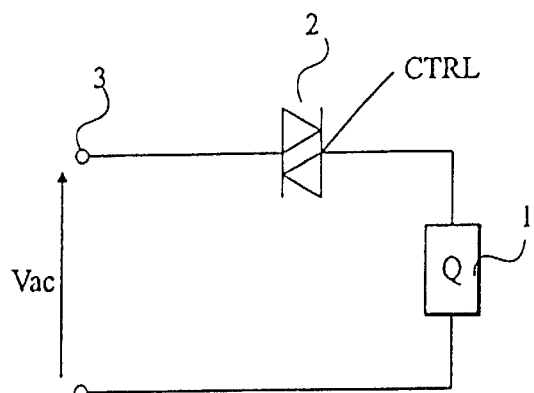
FIGS. 1 to 3, previously described, are meant to show the state of the art and the problem to solve.

The same elements have been designated with the same references in the different drawings. For clarity, only those elements of the switching circuit and of the A.C./A.C. converters which are necessary to the understanding of the present invention have been shown in the drawings and will be described hereafter.

A feature of the present invention is to provide a switching circuit associating a bidirectional switching element controllable to be turned off and to be turned on, to perform the actual controllable switch function, and a bidirectional conduction dipolar element automatically selecting the conduction direction, to perform the free wheel function.

Figure 2:
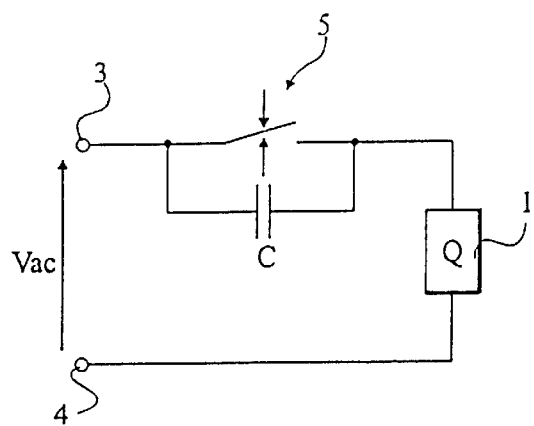
Figure 3:
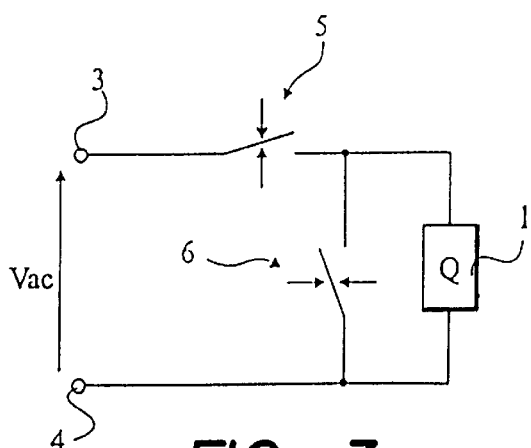
Figure 4:
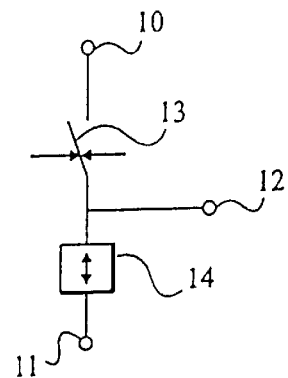
FIG. 4 very schematically shows an embodiment of a switching circuit according to the present invention.

FIG. 4 very schematically shows an embodiment of such a switching circuit. According to the present invention, this switching circuit includes three terminals 10, 11, 12 and thus appears as a tripole. It includes a bidirectional switching element 13 controllable to be turned off and turned on, made for example based on semiconductor components controllable in a single quadrant of their current-voltage characteristic. Said element is, for example, a conventional static switch, similar to switch 5 or 6 used in conventional circuits (FIGS. 2 and 3). Switch 13 is connected in series with a bidirectional conduction element 14 specific to the present invention and which appears as a dipole. According to the present invention, switch 13 and element 14 are series-connected between two terminals 10 and 11, and the midpoint of this series connection defines the third terminal 12 of the tripole.

A feature of element 14 is that its conduction direction is not controllable but is automatically (naturally) selected based on the voltage between terminals 12 and 11.

Another feature of the present invention is that bidirectional conduction element 14 only turns on when the voltage thereacross is imposed by the load that it supplies and when the current in the load is sufficiently high. In other words, conduction element 14 made by means of semiconductor components is such that the absolute value of its avalanche voltage is always higher than the absolute value of the A.C. supply voltage applied to the switching circuit to guarantee that conduction element 14 is off when switching element 13 is on.

Figure 5:
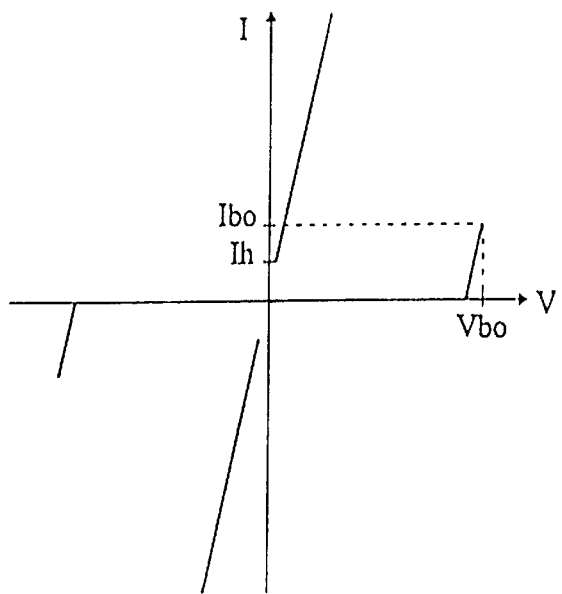
FIG. 5 illustrates the current-voltage characteristic of a bidirectional conduction element of a switching circuit according to the present invention.

FIG. 5 illustrates the current-voltage characteristic of a bidirectional element automatically selecting the conduction direction according to the present invention. This element can only be conductive in the two quadrants where the voltage and the current have the same sign. Its operation is however symmetrical in these two quadrants and its operation will only be discussed in the positive voltage and current quadrant.

Element 14 of the present invention only turns on from the time when voltage V thereacross exceeds a threshold value Vbo and when the current in the load is sufficiently high. From this time on, it behaves as a short-circuit and performs, in the switching circuit of the present invention, the free wheel function. The turning-off of conduction element 14 is conversely caused by the disappearing of current I flowing therethrough. When current I falls under a threshold current Ih, conduction element 14 turns off and becomes equivalent to an open circuit.

Preferably, current Ibo flowing through element 14 upon its turning-on is chosen to be low with respect to the nominal current of the load for which the switching circuit is intended, to minimize the power dissipation in element 14.

With such a current-voltage characteristic, conduction element 14 requires no external control signal to turn on or turn off. Further, it automatically selects the conduction direction based on the voltage present thereacross and according to the level of this voltage, to remain off when switching element 13 is on.

It should be noted that, according to the present invention, the control circuit (not shown) of switching element 13 must be such that it only turns on element 13 when the voltage (V10–V11) between terminals 10 and 11 and the current (flowing from terminal 11 to terminal 12) in the load controlled by the circuit have the same sign. During this period, this control circuit can, for example, control the power of the load by controlling element 13 with a pulse train and by modulating the width of these pulses according to the desired power.

This condition is necessary to ensure the turning-off by current reduction of element 14 under its threshold Ih. In the opposite case, there would be a short-circuit between terminals 11 and 12.

It should however be noted that element 13 can, if desired, remain on during the periods when the voltage and the current are of opposite signs. What matters is that the turning-on of element 13 occurs while the voltage and the current are of same sign.

Figure 6:
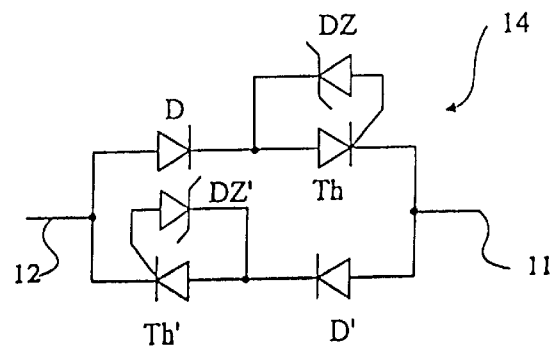
FIG. 6 shows a first embodiment of a bidirectional conduction element having a characteristic such as illustrated in FIG. 5.

FIG. 6 shows a first example of implementation of a conduction element 14 reproducing the characteristic illustrated by FIG. 5 by means of semiconductor components. In this example, element 14 includes, for each conduction direction, a diode D (D') in series with a thyristor Th (Th') between terminals 12 and 11, the thyristor gate being connected to its anode via an avalanche diode DZ (DZ').

With an assembly such as illustrated in FIG. 6, turn-on threshold voltage Vbo of element 14 corresponds to the avalanche voltage of diode DZ and current Ih under which element 14 turns off corresponds to the hold current of thyristor Th.

As an alternative embodiment (not shown), the diode D (D') can be in series with the Zener diode DZ (DZ') between the anode and the gate of the thyristor Th (Th'), the anode of the diode D (D') being connected to terminal 12 (11) and the anode of the diode DZ (DZ') being connected to the gate of the thyristor Th (Th'). An advantage is that there is only one voltage drop (the thyristor voltage drop) on the on-branch of the element 14.

Figure 7:
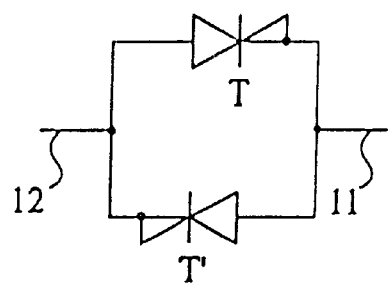
FIG. 7 shows a second embodiment of a bidirectional conduction element having a characteristic such as illustrated in FIG. 5.

FIG. 7 shows a second example of implementation of a conduction element 14 reproducing the characteristic illustrated in FIG. 5 by means of semiconductor components. In this example, element 14 includes, for each conduction direction, a thyristor T (T') between terminals 12 and 11, thyristors T and T' being connected in antiparallel and their gates being short-circuited with the corresponding power terminal. These are, for example, cathode-gate thyristors, the respective gates of which are connected to their respective cathodes. It should be noted that anode-gate thyristors may also be used.

With an assembly such as illustrated in FIG. 7, the turning-on of element 14 occurs on voltage variations (edges) between terminals 11 and 12 as soon as the time derivative of the voltage (dV/dt) multiplied by the stray (intrinsic) capacitance of thyristor T (or T', according to the conduction direction) becomes greater than the turn-on current Ibo of the thyristor involved. One could also provide a capacitor between the anode and the gate of each thyristor to adapt the turn-one time.

As an alternative, the voltage variation (dV/dt), and thus the sensitivity of thyristor T (or T'), may be adjusted by means of a resistor (not shown) interposed between the gate and the corresponding power terminal. For a maximum sensitivity (turning-on under the lowest possible variation dV/dt), the gates may even be left unconnected.

It should be understood that the control of element 13 must then be adapted to avoid generating an excessive voltage variation dV/dt upon its turing-on (to avoid turning on element 14) and to, conversely, turn off relatively fast to cause the turning-on of element 14.

An element 14 such as shown in FIG. 7 enables using thyristors having a smaller avalanche voltage than in the assembly of FIG. 6. Indeed, with an element 14 such as shown in FIG. 6, element 13 must have an avalanche voltage greater than the sum of the threshold voltage of diode DZ (DZ') and of the maximum absolute value of voltage Vac.

It should however be noted that an element 14 such as shown in FIG. 7 requires a control of the voltage edges upon switchings.

The choice between an element 14 such as illustrated in FIG. 6 or in FIG. 7 depends on the application. If the use of components having a relatively small avalanche voltage is privileged, the element of FIG. 7 will for example be chosen. If the simplicity of control of element 13 is privileged, the element of FIG. 6 will for example be chosen.

An advantage of the switching circuit of the present invention is that it is entirely integrable by being exclusively formed of semiconductor components.

Another advantage of this switching circuit is that, as it appears in the form of a tripole, it is versatile and a same circuit can be applied to different A.C./A.C. converters at the cost of minor adaptations of the components used according to the application (in particular, to take account of the nominal operating currents and voltages).

Another advantage of the switching circuit of the present invention is that it only requires two controllable semiconductor components (those necessary to form switching element 13), which makes it particularly economical, especially with respect to the conventional solution illustrated by FIG. 3.

Figure 8:
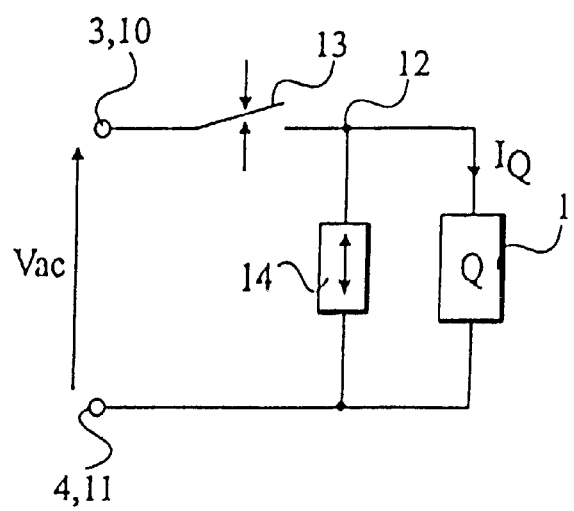
FIG. 8 very schematically shows an embodiment of an A.C./A.C. converter according to the present invention for a gradation function.

FIG. 8 shows an example of application of a switching circuit according to the present invention to the making of a switch or a power gradator of a load 1 (Q).

A switching circuit of the present invention such as that described in relation with FIG. 4 is associated with load 1 by being connected by its terminals 10 and 11 to terminals 3, 4 of application of an A.C. voltage Vac. In this example of application, load 1 is connected in parallel with bidirectional conduction element 14, that is, between terminals 12 and 11. Switching element 13 is thus series-connected with load 1 between terminals 3 and 4 of application of voltage Vac.

Figure 9:
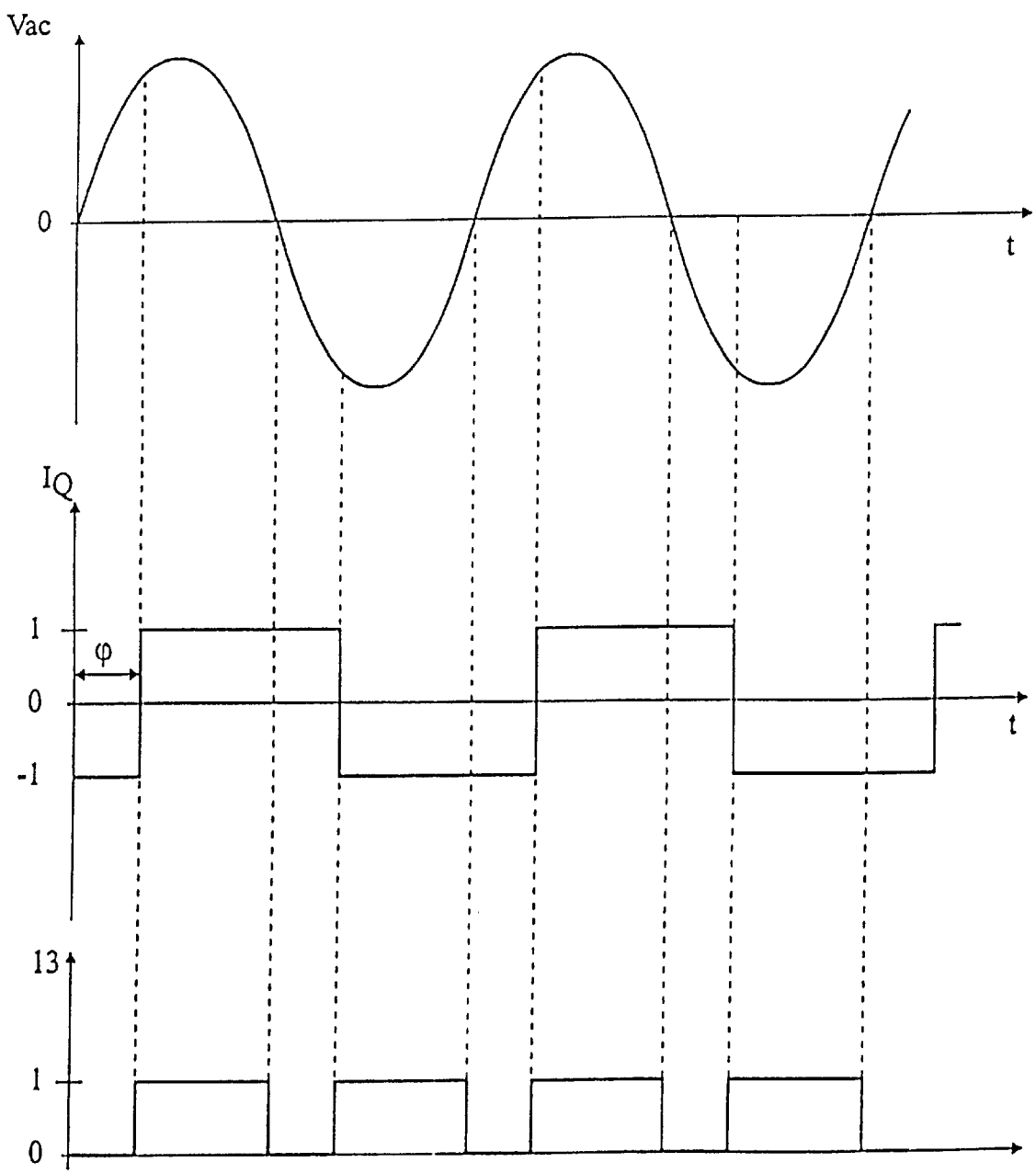
FIG. 9 illustrates, in the form of timing diagrams, the operation of a converter such as shown in FIG. 8.

FIG. 9 illustrates the operation of a power gradator such as shown in FIG. 8. This drawing shows, in the form of timing diagrams, an example of shape of A.C. voltage Vac, of the sign of current $I_Q$ through load 1 and of the periods during which switching element 13 can be controlled to be turned on. For simplification, the periods during which element 13 can be on and where current $I_Q$ is positive are represented by a logic state 1 and the periods during which element 13 must not be controlled to be turned on are represented by a logic state 0, the periods during which current $I_Q$ is negative being represented by a state −1. The phase shift ω between current $I_Q$ and voltage Vac depends on load 1 and on the control of element 13.

Figure 10:
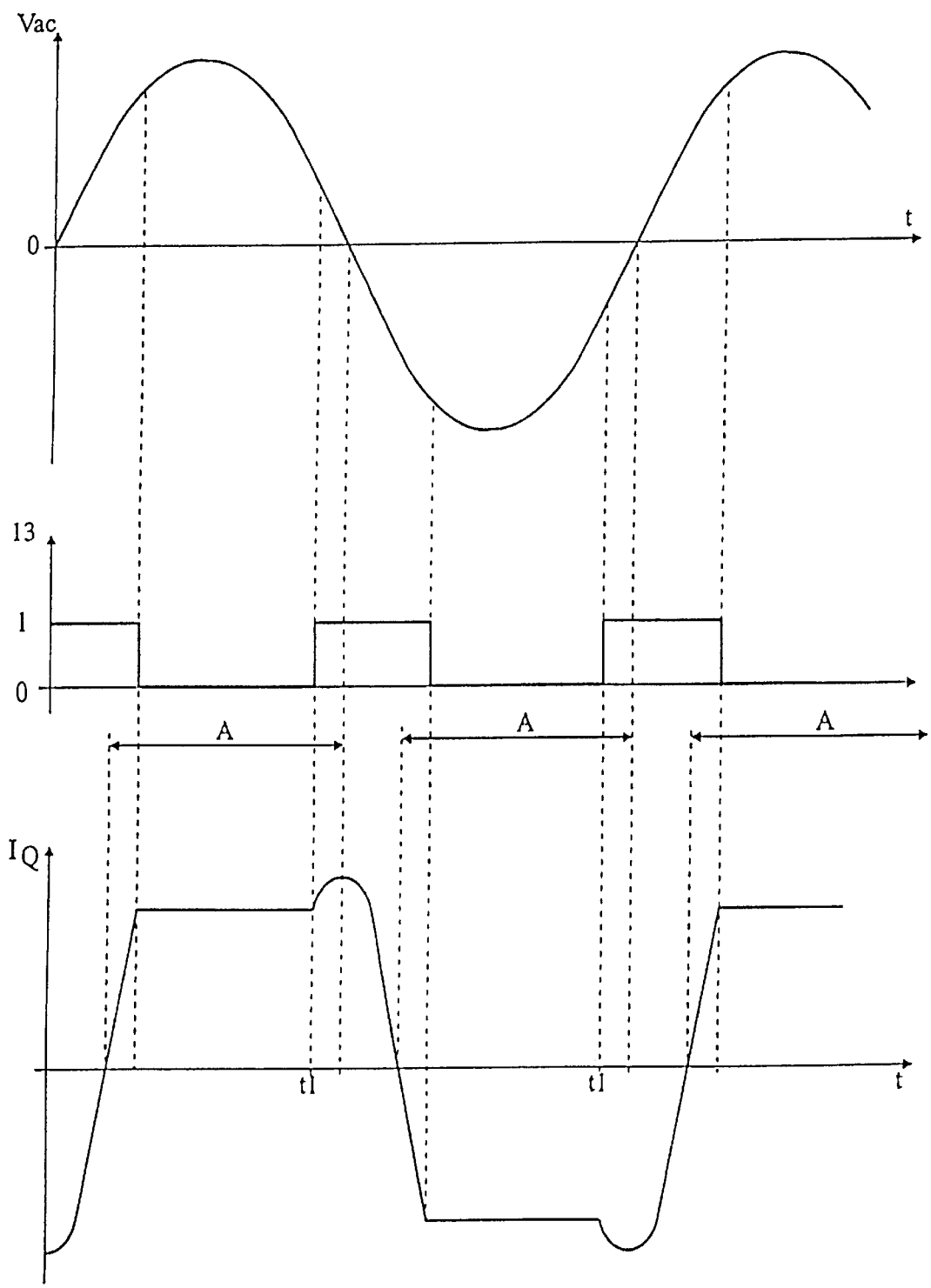
FIG. 10 illustrates, in the form of timing diagrams, an example of control of a converter such as shown in FIG. 8 for a purely inductive load.

FIG. 10 illustrates an example of control of a gradator such as shown in FIG. 8, assuming that load 1 is purely inductive. This drawing shows, in the form of timing diagrams, an example of shape of A.C. voltage Vac, of the on periods of element 13 and of the shape of current $I_Q$ through the load. Element 13 is effectively controlled to be turned on (time t1) as voltage Vac and current $I_Q$ are of same sign (periods represented by arrows A).

Figure 11:
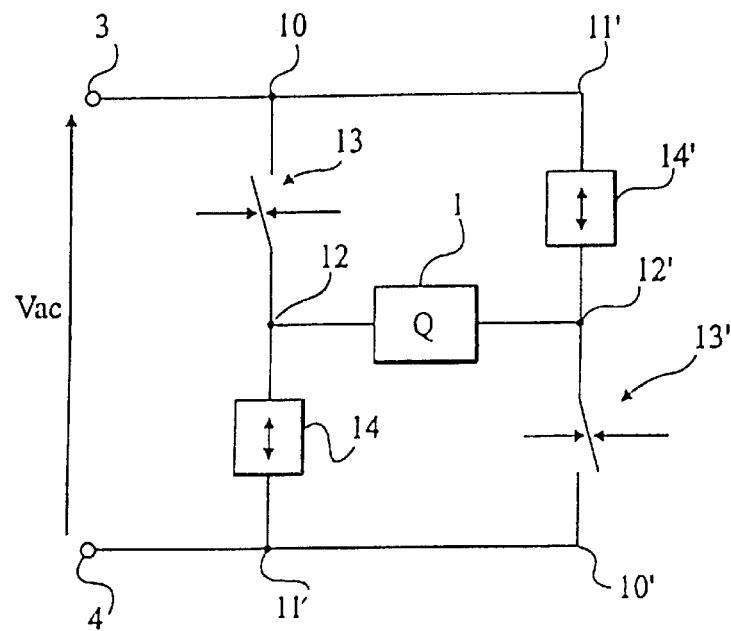
FIG. 11 shows an embodiment of a bridge A.C./A.C. converter, based on switching circuits according to the present invention.

FIG. 11 illustrates a second example of application of a switching circuit according to the present invention to a bridge converter.

According to this example, two switching circuits such as illustrated in FIG. 4 are used. These two circuits are connected in antiparallel between two terminals 3, 4 of application of an A.C. voltage Vac, and load 1 to be controlled is connected between the two respective midpoints of these switching circuits. In FIG. 11, a first switching circuit has been shown using the same references as those in FIG. 4 and a second switching circuit has been shown using these references assigned with an apostrophe. Thus, load 1 is connected between terminals 12 and 12'.

A positive or negative voltage source is then indifferently available for load 1 during a half-period of voltage Vac. It is then, for example, possible to make a direct frequency changer to supply load 1 with a frequency corresponding to an integer multiple or to an integer sub-multiple of the frequency of A.C. voltage Vac.

The operation of a circuit such as shown in FIG. 11 can be deduced from the operation of the previously-discussed switching circuit.

Figure 12:
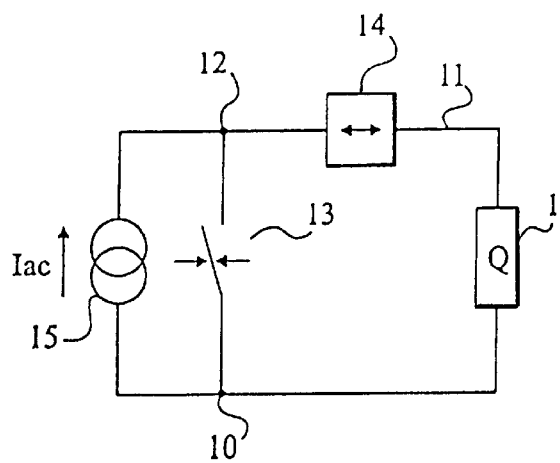
FIG. 12 shows an embodiment of an A.C./A.C. converter, based on a switching circuit according to the present invention, for a power transfer from an alternating current source.

FIG. 12 illustrates a third example of application of a switching circuit according to the present invention to a power transfer towards load 1 from a source 15 of alternating current Iac. In this case, current source Iac is connected between terminals 12 and 10 of the switching circuit, that is, in parallel with switching element 13, and load 1 is connected between terminals 11 and 10, that is, in parallel with the series association of element 13 with bidirectional conduction element 14 of the circuit of the present invention.

Such an A.C./A.C. converter is more specifically intended for an essentially capacitive load.

The present invention has multiple advantages with respect to known A.C./A.C. converters.

Among these advantages, one should note:

as compared to a triac gradator (FIG. 1), the possibility of compensating the reactive power absorbed on the power system, the possibility of reducing the high frequency harmonics by controlling the current variation absorbed on the mains upon the switching (by the control of semiconductor components forming element 13), and the possibility of tuning-off at any moment the circuit in case a defect is detected even when it is conducting a non zero current;

as compared to a capacitor converter (FIG. 2), the fact of avoiding the use of a non integrable component and the fact of avoiding the presence of a leakage current through the load when the circuit is to be turned off; and as compared to a circuit with two bicontrollable switches (FIG. 3), the fact of having a natural rather than a controlled free wheel operation, which brings an operating security, even in case of a defect in the control circuit, and reduces the number of four quadrant bicontrollable components and simplifies the control logic.

Of course, the present invention is likely to have various alterations, modifications, and improvements which will readily occur to those skilled in the art, who will find other applications than those which have been specifically described. In particular, the respective sizings of the different semiconductor components used to form switching element 13 and bidirectional conduction element 14 will be adapted to the application and, especially, to the desired breakdown voltages and to the load powers to be controlled.

It should be noted that other assemblies as those illustrated in FIGS. 6 and 7 may be provided to make element 14, provided that they respect the above-described functionalities.

Further, other types of single-phase A.C./A.C. converters than those described in relation with FIGS. 7 to 10 may be made by means of one or several switching circuits of the present invention. For example, a simple all or nothing switch may be made based on the circuit illustrated in FIG. 8, the all or nothing command including not modulating, by pulse width, the possible on periods of element 13.

Further, the practical implementation of switching element 13 is within the abilities of those skilled in the art. They can, in particular, use any conventional bidirectional static switch operating in the four quadrants of its current-voltage characteristic.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A switching circuit including, in series, a bidirectional switching element controllable to be turned off and turned on, and a bidirectional conduction element forming a dipole and automatically selecting the conduction direction.

2. The switching circuit of claim 1, wherein the bidirectional conduction element selects the conduction direction according to the voltage across a load controlled by the switching circuit.

3. The switching circuit of claim 2, wherein the switching element is turned on only when the voltage across the circuit and the current in the load to be controlled have the same sign.

4. The switching element of claim 1, wherein the bidirectional conduction element includes in antiparallel between two terminals, two series connections of a thyristor with a diode, the gate and the anode of each thyristor being inter connected by an avalanche diode.

5. The switching element of claim 1, wherein the bidirectional conduction element includes, in antiparallel between two terminals, two thyristors, and wherein a gate of a first one of the thyristors is short-circuited to a first one of the two terminals, and a gate of a second one of the thyristors is short-circuited to a second one of the two terminals.

6. A converter of an A.C. voltage or conversely an A.C. current for a load, using at least one switching circuit of claim 1.

7. The converter of claim 6, wherein the load is connected in parallel with the bidirectional conduction element, the load and the bidirectional switching element being connected in series between two terminals for an A.C. voltage.

8. The converter of claim 6, wherein the load is connected in parallel with the series association of the switching element and of the bidirectional conduction element, a source of alternating current being connected in parallel with the switching element.

9. The converter of claim 6, wherein the at least one switching circuit includes two switching circuits and wherein the load is connected between two respective midpoints of two of the switching circuits.

10. The converter of claim 1, wherein the bidirectional conduction element selects the conduction direction according to the voltage level across terminals of the bidirectional conduction element.

11. The converter of claim 1, wherein the bidirectional conduction element selects the conduction direction according to the voltage variation across terminals of the bidirectional conduction element.

12. A circuit comprising:
a bidirectional switch controllable to be turned off and turned on;
a bidirectional conduction element in series with the bidirectional switch, the bidirectional conduction element having two terminals and automatically selecting a conduction direction; and
wherein the bidirectional conduction element comprises two thyristors in antiparallel between the two terminals.

13. The circuit of claim 12 wherein the bidirectional conduction element includes a diode and an avalanche diode between an anode and a gate of each thyristor.

14. The circuit of claim 12 wherein the bidirectional conduction element includes a resistor between an anode and a gate of each thyristor.

15. The circuit of claim 12 wherein the bidirectional conduction element includes a capacitor between a power terminal and a gate of each thyristor.

16. A circuit comprising:
a bidirectional switch controllable to be turned off and turned on; and
a bidirectional conduction element in series with the bidirectional switch, the bidirectional conduction element having two terminals and automatically selecting a conduction direction, wherein the bidirectional conduction element turns on only when the bidirectional switch is turned off.

17. The circuit of claim 16 wherein the turn-on threshold of the bidirectional conduction element is an avalanche voltage of the bidirectional conduction element.

18. The circuit of claim 16 wherein the bidirectional conduction element has a turn-on threshold voltage an absolute value of which is greater than an absolute value of a voltage from a supply connected to the bidirectional switch.

19. The circuit of claim 16 wherein the circuit is connected to a load and the bidirectional conduction element turns on only during free wheel of a load current.

20. The circuit of claim 16, wherein the circuit is connected to a load and the bidirectional switch is turned on only when a voltage across the circuit and a load current have a same sign.

21. The circuit of claim 16, wherein the bidirectional conduction element includes, in antiparallel between two terminals, two thyristors.

22. The circuit of claim 16, wherein the bidirectional conduction element includes, in antiparallel between two terminals, two thyristor with a diode, a gate and an anode of each thyristor being interconnected by an avalanche diode.

23. The circuit of claim 21 wherein the bidirectional conduction element includes a diode and an avalanche diode between an anode and a gate of each thyristor.

24. The circuit of claim 21 wherein the bidirectional conduction element includes a resistor between an anode and a gate of each thyristor.

25. The circuit of claim 21 wherein the bidirectional conduction element includes a capacitor between a power terminal and a gate of each thyristor.

26. The circuit of claim 16, wherein the bidirectional conduction element includes, in antiparallel between two terminals, two thyristors, and wherein a gate of a first one of the thyristors is short-circuited to a first one of the two terminals, and a gate of a second one of the thyristors is short-circuited to a second one of the two terminals.

27. The circuit of claim 16, wherein the bidirectional conduction element selects the conduction direction according to a voltage level across the two terminals of the bidirectional conduction element.

28. The circuit of claim 16, wherein the bidirectional conduction element selects the conduction direction according to a voltage variation across terminals of the bidirectional conduction element.

29. The circuit of claim 16 wherein the bidirectional switch and the bidirectional conduction element are each configured to conduct current in a first direction, conduct current in a second direction, and block current.

30. A converter of an A.C. voltage or conversely an A.C. current for a load, using at least one circuit of claim 16.

31. The converter of claim 30, wherein a load is connected in parallel with the bidirectional conduction element, the load and the bidirectional switch being connected in series between two terminals for an A.C. voltage.

32. The converter of claim 30, wherein a load is connected in parallel with the series association of the bidirectional switch and the bidirectional conduction element, a source of alternating current being connected in parallel with the bidirectional switch.

33. The converter of claim 30, wherein the at least one circuit includes two circuits and wherein a load is connected between two respective midpoints of the two circuits.

34. The converter of claim 33, wherein the two circuits are in antiparallel.

35. A circuit including:
a bidirectional switch controllable to be turned off and turned on; and
bidirectional conduction element, in series with the bidirectional switch, the bidirectional conduction element having two terminals, and including means for automatically selecting a conduction direction, in response to voltages at the two terminals.

36. The circuit of claim 35, wherein the means for automatically selecting a conduction direction includes means for selecting a conduction direction according to a voltage across a load connected to the circuit.

37. The circuit of claim 36, wherein the bidirectional switch includes means for turning-on the bidirectional switch only when a voltage across the circuit and a current in a load connected to the circuit have the same sign.

38. The circuit of claim 35, wherein the bidirectional conduction element includes, in antiparallel between two terminals, two thyristors.

39. The circuit of claim 35, wherein the bidirectional conduction element includes, in antiparallel between two terminals, two thyristor with a diode, a gate and an anode of each thyristor being interconnected by an avalanche diode.

40. The circuit of claim 38 wherein the bidirectional conduction element includes a diode and an avalanche diode between an anode and a gate of each thyristor.

41. The circuit of claim 38 wherein the bidirectional conduction element includes a resistor between an anode and a gate of each thyristor.

42. The circuit of claim 38 wherein the bidirectional conduction element includes a capacitor between a power terminal and a gate of each thyristor.

43. The circuit of claim 35, wherein the bidirectional conduction element includes, in antiparallel between two terminals, two thyristors, and wherein a gate of a first one of the thyristors is short-circuited to a first one of the two terminals, and a gate of a second one of the thyristors is short-circuited to a second one of the two terminals.

44. The circuit of claim 35, wherein the means for automatically selecting a conduction direction includes means for selecting the conduction direction according to a voltage level across the two terminals.

45. The circuit of claim 35, wherein the means for automatically selecting a conduction direction includes means for selecting the conduction direction according to a voltage variation across the two terminals.

46. The circuit of claim 35 wherein the bidirectional conduction element includes means for conducting current in a first direction, conducting current in a second direction, and blocking current.

47. A converter of an A.C. voltage or conversely an A.C. current for a load, using at least one circuit of claim 35.

48. The converter of claim 47, wherein a load is connected in parallel with the bidirectional conduction element, the load and the bidirectional switch being connected in series between two terminals for an A.C. voltage.

49. The converter of claim 47, wherein a load is connected in parallel with the series association of the bidirectional switch and the bidirectional conduction element, a source of alternating current being connected in parallel with the bidirectional conduction element.

50. The converter of claim 47, wherein the at least one circuit includes two circuits and wherein a load is connected between two respective midpoints of the two circuits.

51. The converter of claim 50, wherein the two circuits are in antiparallel.

52. The circuit of claim 35 wherein the bidirectional conduction element comprises means for turning on only when the bidirectional switch is turned off.

53. The circuit of claim 35 wherein the bidirectional conduction element comprises a threshold voltage the absolute value of which is greater than an absolute value of a voltage from a supply.

54. The circuit of claim 35 wherein the bidirectional conduction element comprises means for turning on only during freewheel operation.

55. A method for use in a circuit having a bidirectional switch controllable to be turned off and turned on, the circuit further having two terminals, a first one of which is in series with the bidirectional switch, the method comprising:
conducting current in two directions between the two terminals; and
automatically initiating the current in response only to voltages at the two terminals, and only when the bidirectional switch is turned off.

56. The method of claim 55 wherein conducting current in two directions comprises automatically selecting a conduction direction according to a voltage across the two terminals.

57. The method of claim 55 further comprising turning-on the bidirectional switch only when a voltage across the circuit and a current in a load between the two terminals have the same sign.

58. The method of claim 55 wherein conducting current in two directions includes providing a bidirectional conduction path that includes, in antiparallel between two terminals, two thyristors.

59. The method of claim 55 wherein conducting current in two directions includes automatically selecting a current direction according to a voltage level across the two terminals.

60. The method of claim 55 wherein conducting current in two directions includes automatically selecting a current direction according to a voltage variation across the two terminals.

61. The method of claim 55 wherein automatically initiating the current comprises automatically initiating the current only when an absolute value of a voltage across the terminals is greater than an absolute value of a voltage from a supply connected to the circuit.

62. The method of claim 61 wherein automatically initiating the current includes automatically initiating the current in response to a voltage across the two terminals.

63. The method of claim 61 further comprising turning-on the bidirectional switch only when the voltage across the circuit and the current in a load between the two terminals have the same sign.

64. The method of claim 61 wherein conducting current in two directions includes providing a bidirectional conduction path that includes, in antiparallel between two terminals, two thyristors.

65. The method of claim 61 wherein conducting current in two directions includes automatically selecting a current direction according to a voltage level across the two terminals.

66. The method of claim 61 wherein conducting current in two directions includes automatically selecting a current direction according to a voltage variation across the two terminals.

67. The method of claim 61 wherein conducting current in two directions includes providing a conduction path that has semiconductors and an avalanche voltage, the absolute voltage of which is greater than an absolute value of a voltage from the supply.

68. The method of claim 55 wherein automatically initiating the current comprises initializing the current only during freewheel operation.

69. The method of claim 68 wherein automatically initiating the current includes automatically initiating the current in response to a voltage across the two terminals.

70. The method of claim 68 further comprising turning-on the bidirectional switch only when a voltage across the circuit and a current in a load between the two terminals have the same sign.

71. The method of claim 68 wherein conducting current in two directions includes providing a bidirectional conduction path that includes, in antiparallel between two terminals, two thyristors.

72. The method of claim 68 wherein conducting current in two directions includes automatically selecting a current direction according to a voltage level across the two terminals.

73. The method of claim 68 wherein conducting current in two directions includes automatically selecting a current direction according to a voltage variation across the two terminals.

74. The method of claim 68 wherein conducting current in two directions includes providing a conduction path that has semiconductors and an avalanche voltage, the absolute voltage of which is greater than an absolute value of a voltage from a supply connected to the circuit.

75. The method of claim 68 wherein automatically initiating includes initiating the current only during freewheel operation.

* * * * *